United States Patent
Taguchi et al.

(10) Patent No.: US 7,392,760 B2
(45) Date of Patent: Jul. 1, 2008

(54) MICROWAVE-EXCITED PLASMA PROCESSING APPARATUS

(75) Inventors: Yoji Taguchi, Susono (JP); Maiko Yoshida, Susono (JP); Kohta Kusaba, Yokohama (JP); Kibatsu Shinohara, Yokohama (JP); Munekazu Matsuo, Machida (JP); Kazuhiro Watanabe, Susono (JP)

(73) Assignee: ULVAC, Inc. (JP)

( * ) Notice: Subject to any disclaimer, the term of this patent is extended or adjusted under 35 U.S.C. 154(b) by 371 days.

(21) Appl. No.: 10/989,106

(22) Filed: Nov. 16, 2004

(65) Prior Publication Data

US 2005/0145178 A1   Jul. 7, 2005

(30) Foreign Application Priority Data

Nov. 17, 2003   (JP)   ............... 2003-387057

(51) Int. Cl.
  *C23C 16/00*  (2006.01)
  *C23F 1/00*   (2006.01)
  *H01L 21/306* (2006.01)

(52) U.S. Cl. ............... 118/723 MW; 156/345.41; 156/345.42; 156/345.46; 156/345.49

(58) Field of Classification Search ......... 118/723 MW; 156/345.36, 345.41
See application file for complete search history.

(56) References Cited

U.S. PATENT DOCUMENTS 3,680,142 A * 7/1972 Van Atta et al. ............. 343/770
4,160,145 A * 7/1979 Rueggeberg ................ 219/691
4,463,239 A * 7/1984 Miller ........................ 219/749
5,874,715 A * 2/1999 Choi ........................... 219/746
6,343,565 B1 * 2/2002 Hongoh .............. 118/723 MW
6,607,633 B2 * 8/2003 Noguchi ................ 156/345.41

FOREIGN PATENT DOCUMENTS

| EP | 0 591 975 A1 | 4/1994 |
| EP | 0 688 038 A2 | 12/1995 |
| EP | 0 771 017 A1 | 5/1997 |
| JP | 9-129613 | 5/1997 |
| JP | 11-111620 | 4/1999 |

* cited by examiner

*Primary Examiner*—Parviz Hassanzadeh
*Assistant Examiner*—Rakesh K Dhingra
(74) *Attorney, Agent, or Firm*—Stites & Harbison PLLC; Ross F. Hunt, Jr.

(57) ABSTRACT

A microwave-excited plasma processing apparatus shows a wide pressure range and a wide applicable electric power range for normal electric discharges as a result of using slits cut through a rectangular waveguide and having a profile that allows the electric field and the magnetic field of microwave to be formed uniformly right below the microwave introducing window below an microwave antenna. The microwave-excited plasma processing apparatus is characterized by having four elliptic slits cut through the wall of the rectangular waveguide that is held in contact with the microwave introducing window of the top wall of the vacuum chamber, the four elliptic slits being arranged respectively along the four sides of a substantial square.

1 Claim, 14 Drawing Sheets

CROSS SECTION OF MAGNETIC FIELD
PRIOR ART

MAGNETIC FIELD RIGHT BELOW
MICROWAVE INTRODUCING WINDOW
PRIOR ART

CROSS SECTION OF ELECTRIC FIELD
PRIOR ART

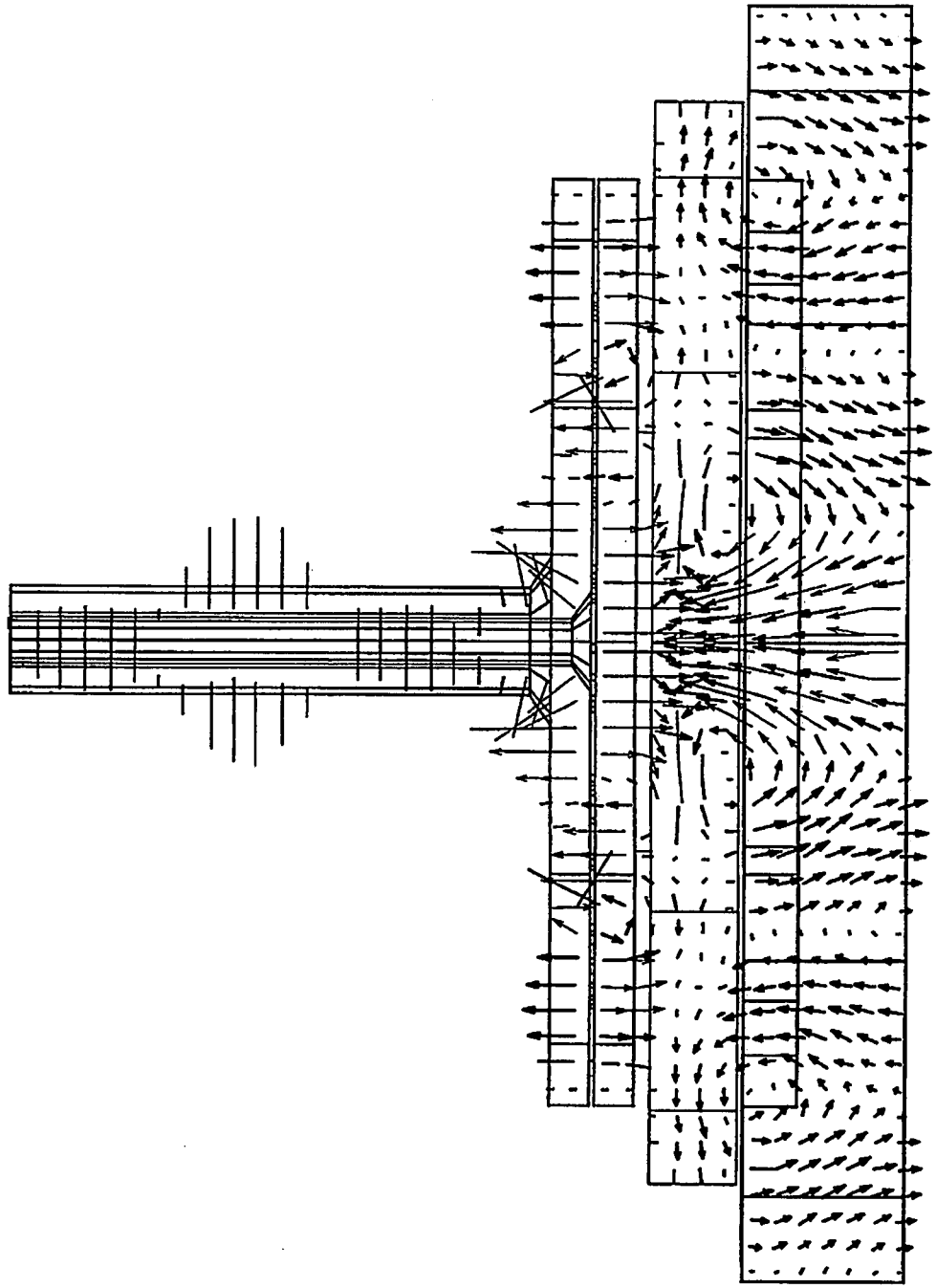

ELECTRIC FIELD RIGHT BELOW
MICROWAVE INTRODUCING WINDOW
PRIOR ART

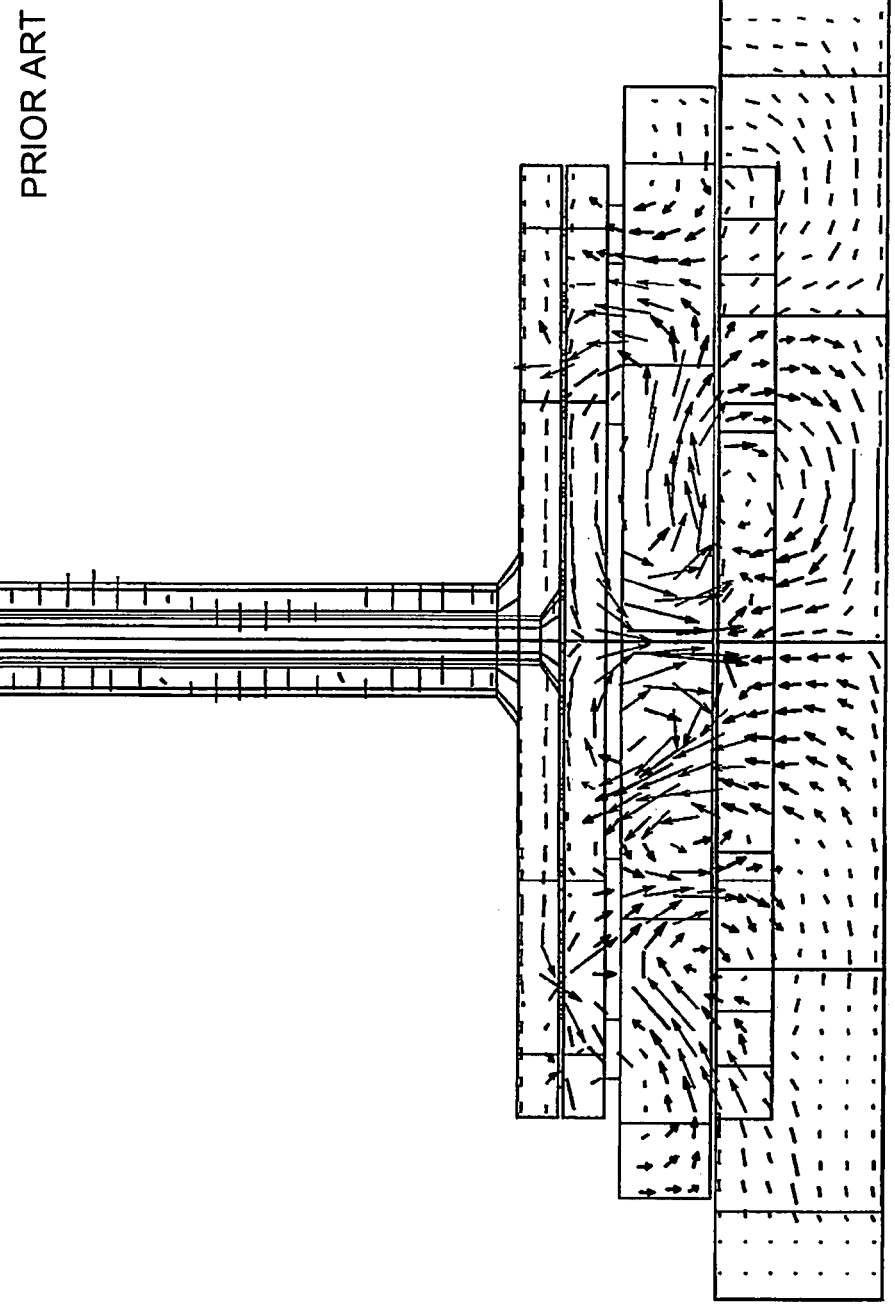

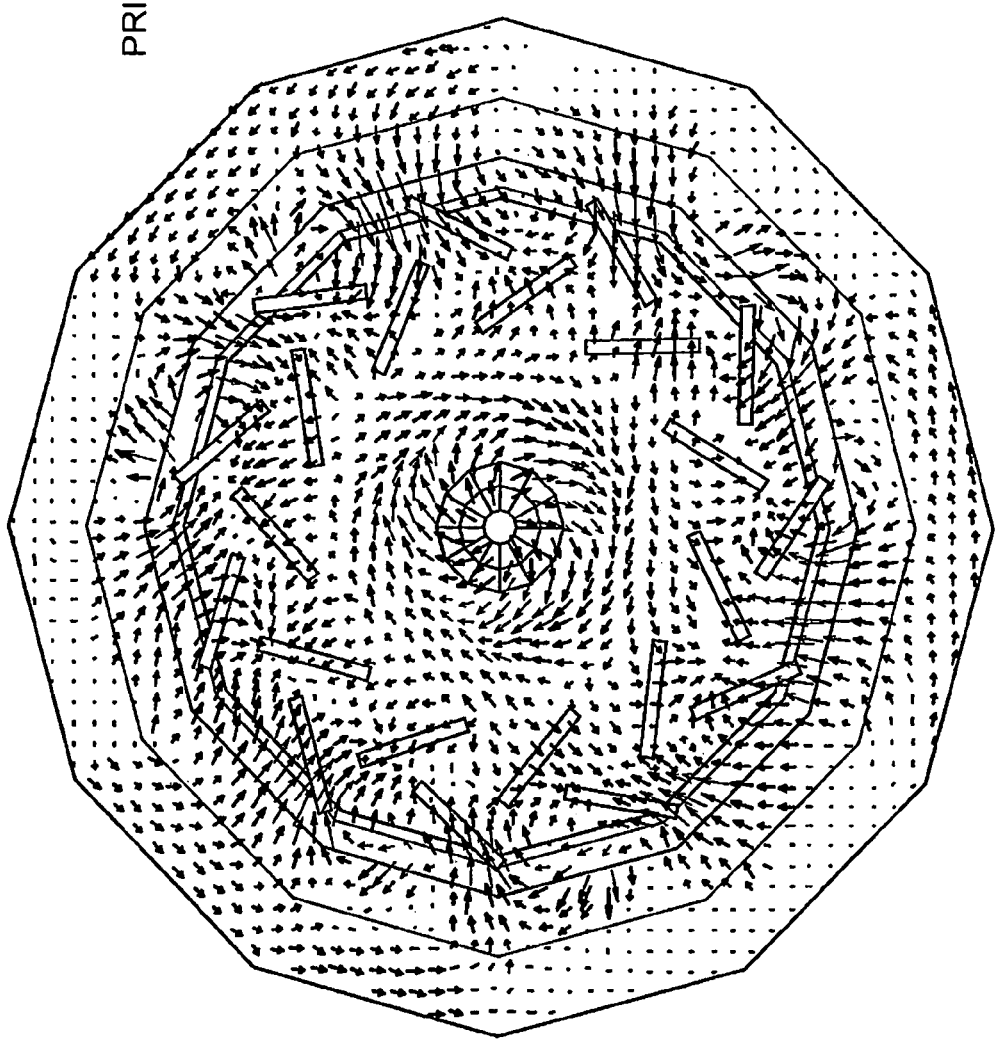

CROSS SECTION OF MAGNETIC FIELD

MAGNETIC FIELD RIGHT BELOW
MICROWAVE INTRODUCING WINDOW

CROSS SECTION OF ELECTRIC FIELD

ELECTRIC FIELD RIGHT BELOW
MICROWAVE INTRODUCING WINDOW

MICROWAVE-EXCITED PLASMA PROCESSING APPARATUS

BACKGROUND OF THE INVENTION

1. Field of the Invention

The present invention relates to a plasma processing apparatus for manufacturing semiconductor devices.

2. Related Background Art

Conventional techniques of radiating a microwave from a microwave antenna and irradiating processing gas with it in order to generate plasma thereof and cause the generated plasma to act on a Si substrate for manufacturing semiconductor devices for a predetermined processing operation include one that utilizes a microwave waveguide provided with one or more than one slits and one adapted to feed a microwave to a disk provided with coaxially arranged slits (see Patent Document 1: Japanese Patent Application Laid-Open Publication No. 9-129613 and Patent Document 2: Japanese Patent Application Laid-Open Publication No. 11-111620).

FIG. 1 of the accompanying drawings illustrates a conventional microwave antenna that is described in Patent Document 1. The microwave antenna comprises a waveguide A that has a bottom B and a reflection surface C. A pair of slits D are cut through the bottom B of waveguide A so as to show a profile with a width that is narrowed stepwise toward the reflection plane C of the waveguide A in order to allow the reflected wave reflected by the reflection surface C and the incident wave to produce a uniformly synthesized wave.

FIG. 2 of the accompanying drawings illustrates another conventional microwave antenna that is described in Patent Document 2. It is a radial line slot antenna. The radial line slot antenna is provided with a number of coaxially arranged slots E and the circularly polarized microwave generated from the slots E is introduced into a vacuum chamber so as to generate and excite plasma by means of the electric field of the microwave.

The inventors of the present invention actually prepared antennas according to the descriptions of Patent Documents 1 and 2 and operated them to see how they perform in an experiment. As a result of the experiment, it was found that the both antennas can be driven to operate only within a narrow pressure range and a narrow applicable electric power range for normal electric discharges as shown in Tables 1 and 2 below. Tables 1 and 2 summarily show the results of the experiments obtained respectively by using a microwave antenna according to Patent Document 1 and a microwave antenna according to Patent Document 2.

TABLE 1

| applied electric power/pressure | 20 Pa | 50 Pa | 90 Pa |
|---|---|---|---|
| 1.0 kW | X | X | ◯ |
| 1.5 kW | ◯ | ◯ | X |
| 1.8 kW | ◯ | X | X |
| 2.0 kW | X | X | X |

N.B.:
◯ indicates that a normal electric discharge was allowed.
X indicates that a normal electric discharge was not allowed because of a large reflected wave.

TABLE 2

| applied electric power/pressure | 20 Pa | 50 Pa | 90 Pa |
|---|---|---|---|
| 1.0 kW | X | X | ◯ |
| 1.5 kW | X | X | ◯ |
| 1.8 kW | X | X | ◯ |
| 2.0 kW | X | X | ◯ |

N.B.:
◯ indicates that a normal electric discharge was allowed.
X indicates that a normal electric discharge was not allowed because of a large reflected wave.

The reason for the narrow pressure range and the narrow applicable electric power range may be that a large voltage standing wave ratio (VSWR) of the reflected wave/the progressive wave arises due to an unbalanced electromagnetic field of microwave that is found right below the microwave introducing window. Therefore, the electromagnetic field that is found right below the microwave introducing window below a microwave antenna as described in each of Patent Documents 1 and 2 was determined by simulation. As a result, local concentrations and asymmetries of electromagnetic field were found as shown in FIGS. 3A, 3B, 3C and 3D and FIGS. 4A, 4B, 4C and 4D.

SUMMARY OF THE INVENTION

In view of the above identified circumstances, it is therefore the object of the present invention to provide a microwave-excited plasma processing apparatus showing a wide pressure range and a wide applicable electric power range for normal electric discharges by using slits cut through a rectangular waveguide and having a profile that allows the electric field and the magnetic field of microwave to be formed uniformly right below the microwave introducing window below an microwave antenna.

According to the present invention, the above object of the invention is achieved by providing a microwave-excited plasma processing apparatus comprising:

a vacuum chamber having an aperture formed through a top wall thereof, a processing table arranged below said aperture to hold a substrate to be processed thereon and a microwave introducing window arranged above said aperture of the top wall so as to maintain the inside of the vacuum chamber in vacuum;

a gas supply pipe for supplying processing gas into the vacuum chamber;

an exhaust system for exhausting the inside of the vacuum chamber to maintain it in vacuum; and a rectangular waveguide arranged on and in contact with the microwave introducing window, the rectangular waveguide having a terminal plane arranged perpendicularly relative to the traveling direction of the microwave in the rectangular waveguide, a microwave antenna being formed by forming four slits through the wall of the waveguide held in contact with the microwave introducing window, the four slits being arranged along the respective four sides of a quadrangle, each of the slits running either in parallel with or perpendicularly relative to the microwave progressing direction.

In a microwave-excited plasma processing apparatus according to the invention, each of the slits may be elliptic.

In a microwave-excited plasma processing apparatus according to the invention, the center of the slit located closest to the terminal plane of the rectangular waveguide may be arranged at a position defined to be equal to n/2 (n being an integer) of the wavelength ($\lambda_g$) of the microwave from the terminal plane in the rectangular waveguide and the center of the slit located at a position opposite to the slit located closest to the terminal plane waveguide may be arranged at a position defined to be equal to m/2 (m being an integer) of the wavelength ($\lambda_g$) of the microwave from the slit located closest to the terminal plane in the rectangular waveguide.

In a microwave-excited plasma processing apparatus according to the invention, the major axis of each of the slits may be defined to equal to k/2 (k being an integer) of the wavelength ($\lambda_O$) of the microwave in vacuum.

In a microwave-excited plasma processing apparatus according to the invention, the rectangular waveguide is provided with a terminal plane arranged in the rectangular waveguide perpendicularly relative to the progressing direction of the microwave in order to reflect a microwave and an microwave antenna is formed by forming four slits through the wall of the waveguide held in contact with the microwave introducing window, the four slits being arranged along the respective four sides of a quadrangle, each of the slits running either in parallel with or perpendicularly relative to the microwave progressing direction. With this arrangement, it is possible to reduce the VSWR and obtain a large process margin.

BRIEF DESCRIPTION OF THE DRAWINGS

FIG. 4A is a schematic cross sectional view showing the magnetic field of the conventional microwave antenna of FIG. 2 obtained as a result of an electromagnetic field simulation of the microwave antenna;

FIG. 4C is a schematic cross sectional view showing the electric field of the conventional microwave antenna of FIG. 2 obtained as a result of an electromagnetic field simulation of the microwave antenna;

FIG. 4D is a schematic illustration of the electric field right below the microwave introducing window obtained as a result of an electromagnetic field simulation of the conventional microwave antenna of FIG. 2;

DETAILED DESCRIPTION OF THE PREFERRED EMBODIMENT

Now, the present invention will be described by referring to the accompanying drawings that illustrate a preferred embodiment of the invention.

Figure 1:
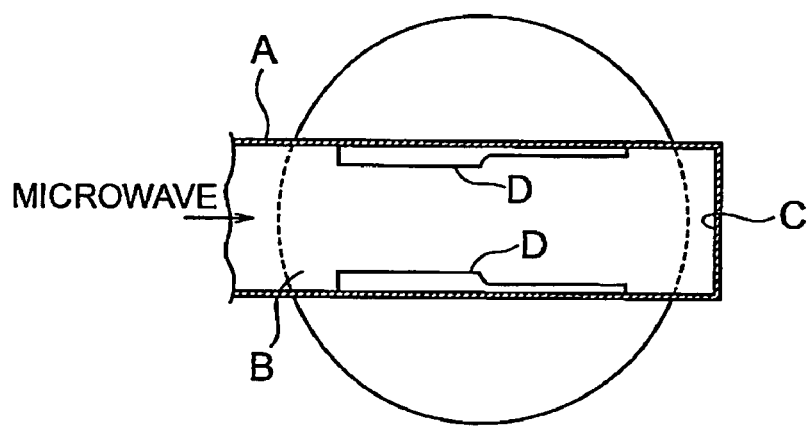
FIG. 1 is a schematic transversal cross sectional view showing a principal part of a conventional microwave antenna.
Figure 2:
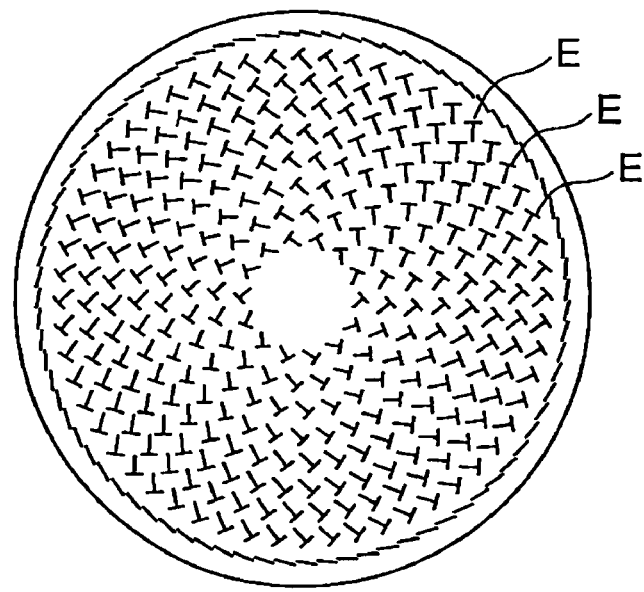
FIG. 2 is a schematic plan view showing another conventional microwave antenna.
Figure 3A:
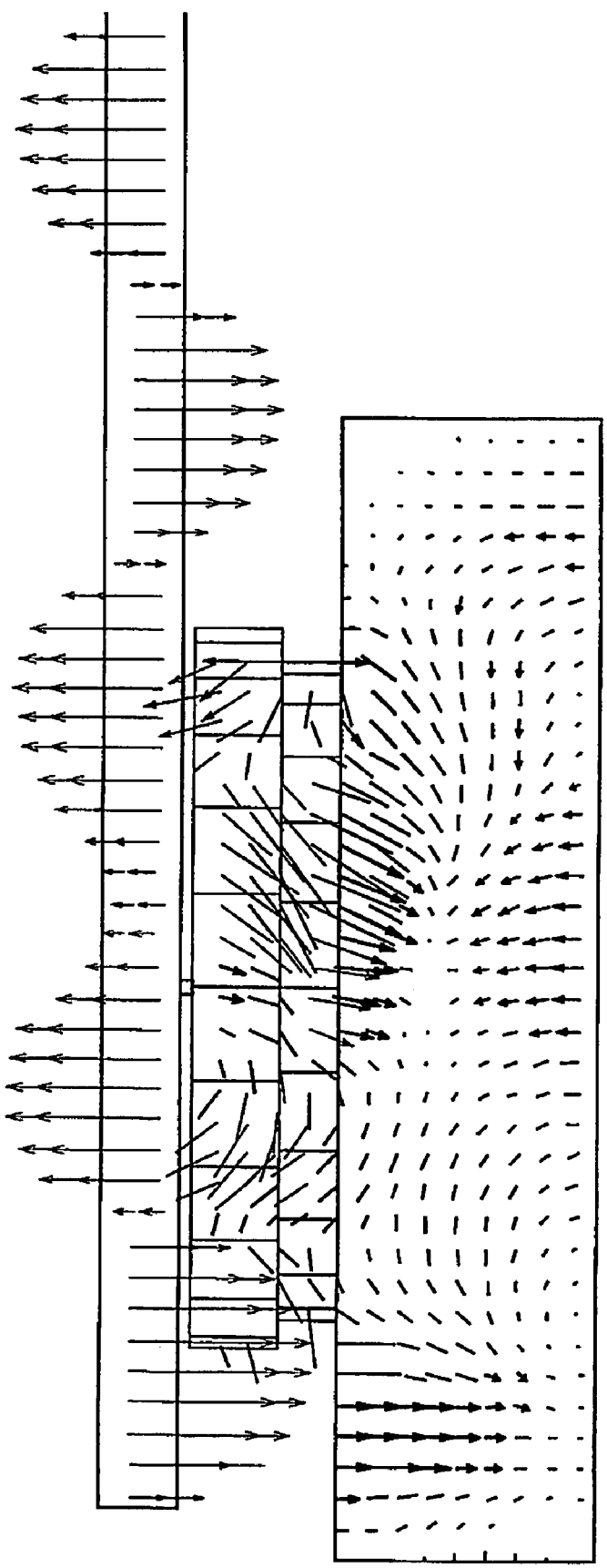
FIG. 3A is a schematic cross sectional view showing the magnetic field of the known microwave antenna of FIG. 1 obtained as a result of an electromagnetic field simulation of the microwave antenna.
Figure 3B:
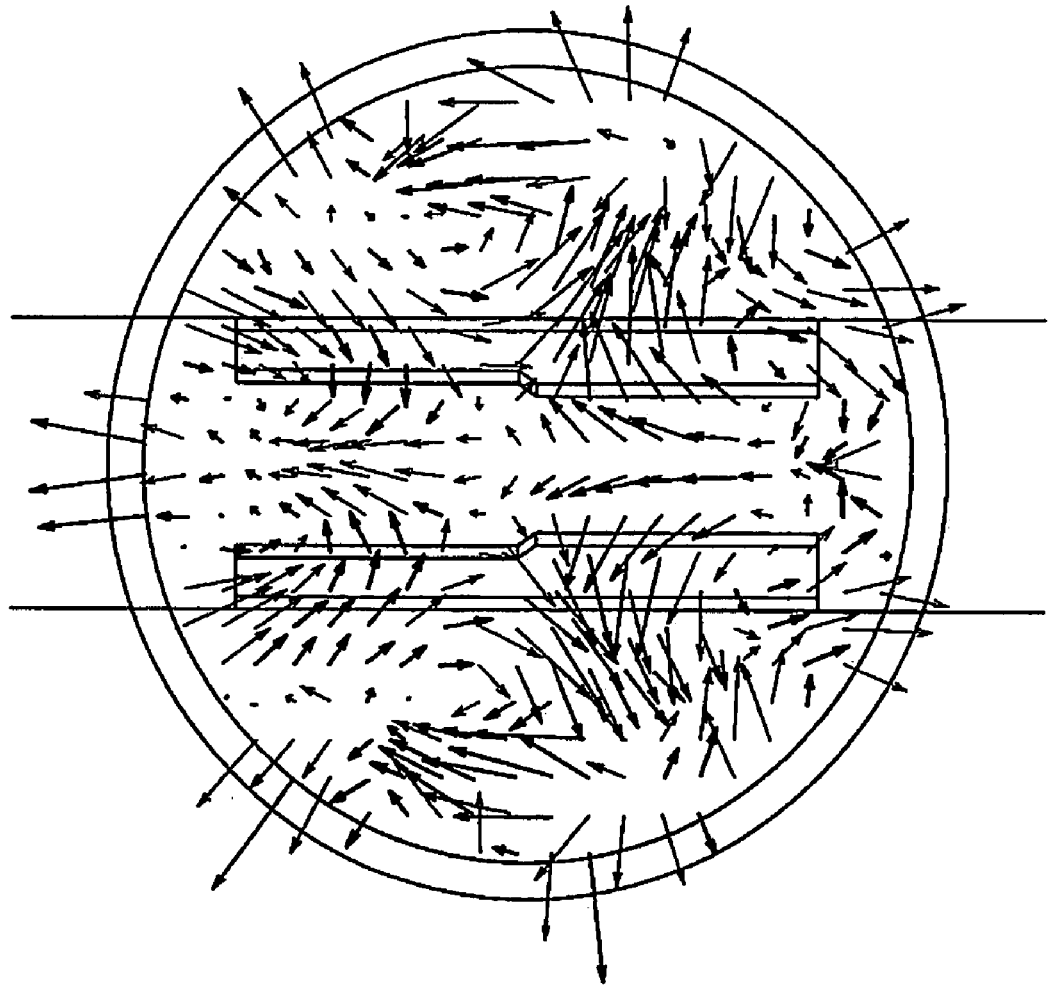
FIG. 3B is a schematic illustration showing the magnetic field right below the microwave introducing window obtained as a result of an electromagnetic field simulation of the conventional microwave antenna of FIG. 1.
Figure 3C:
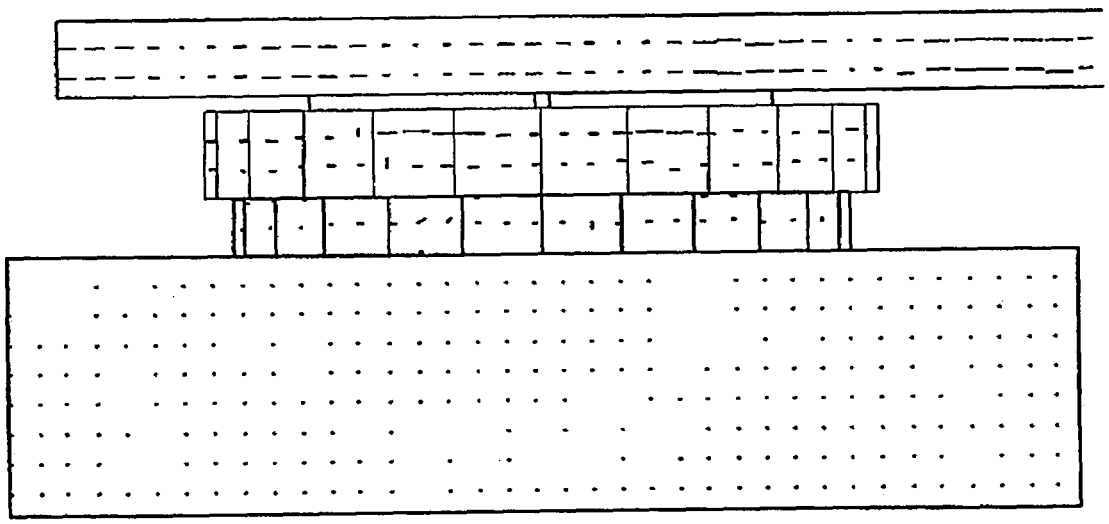
FIG. 3C is a schematic cross sectional view showing the electric field of the known microwave antenna of FIG. 1 obtained as a result of an electromagnetic field simulation of the microwave antenna.
Figure 3D:
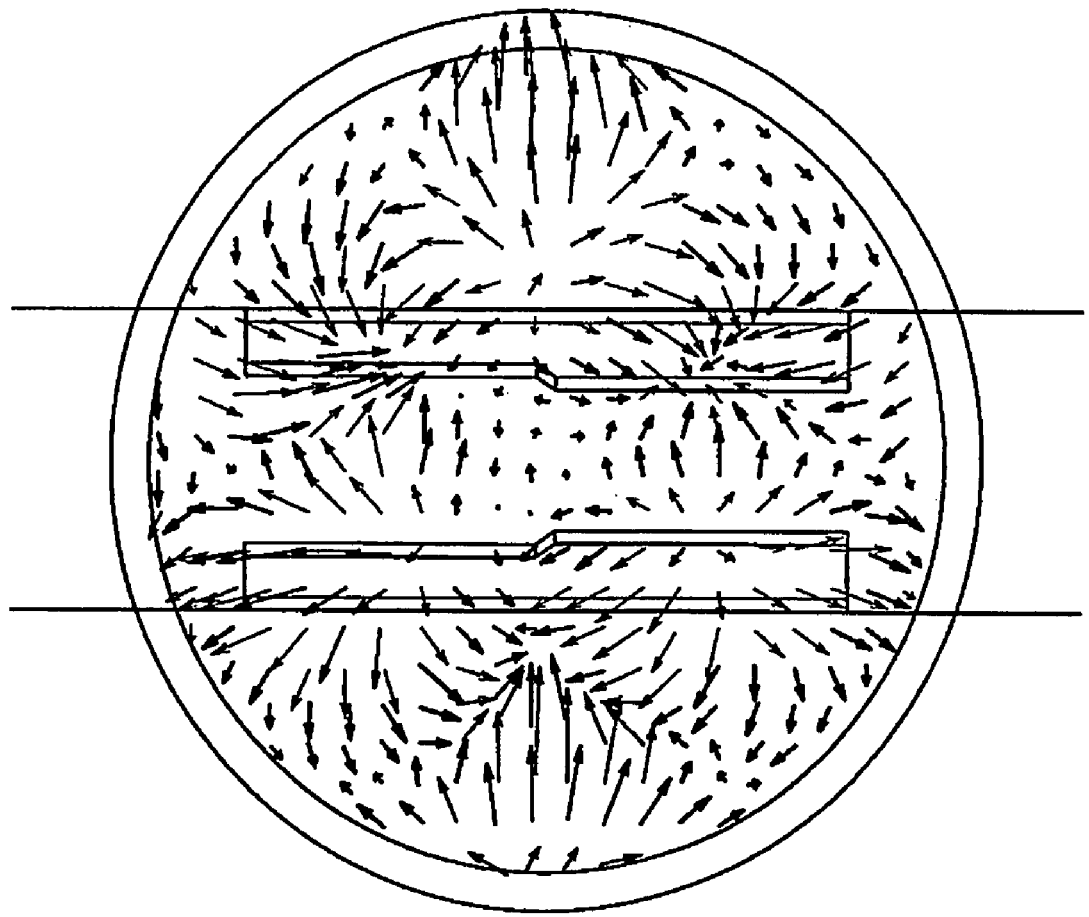
FIG. 3D is a schematic illustration of the electric field right below the microwave introducing window obtained as a result of an electromagnetic field simulation of the conventional microwave antenna of FIG. 1.
Figure 4B:
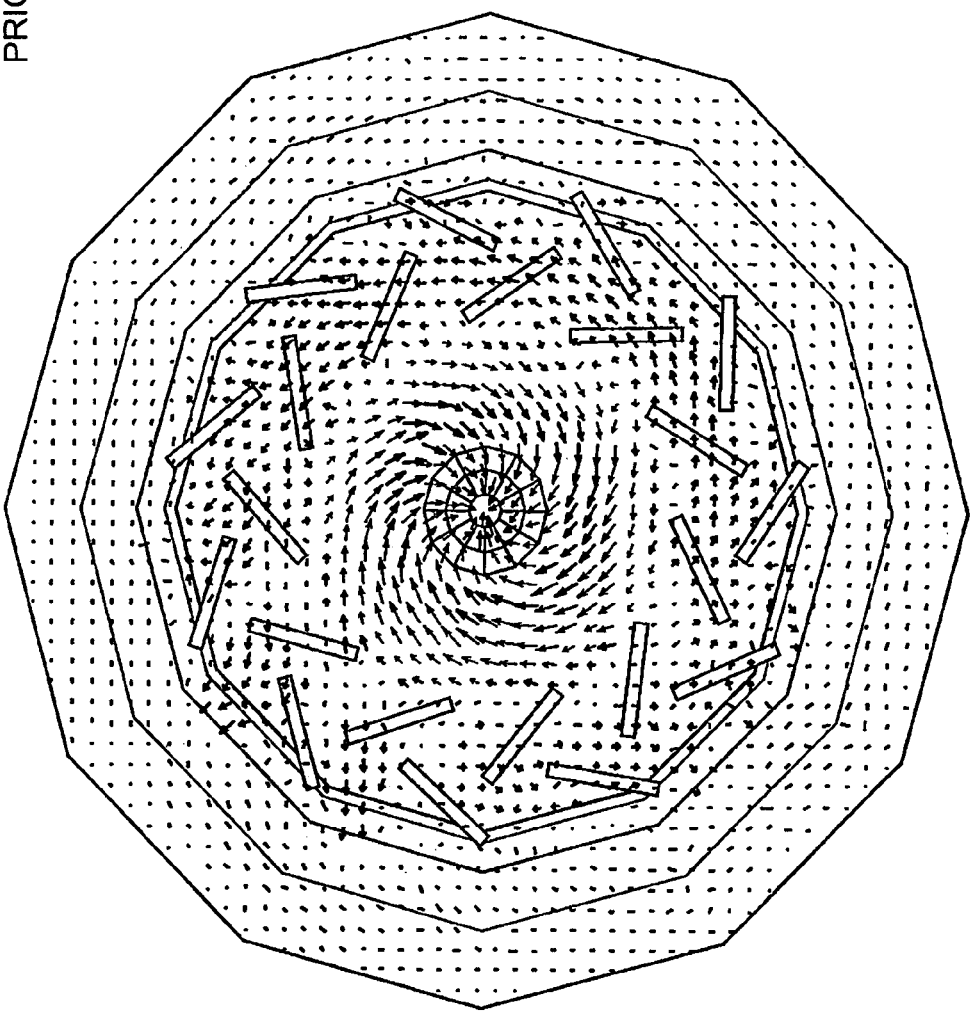
FIG. 4B is a schematic illustration of the magnetic field right below the microwave introducing window obtained as a result of an electromagnetic field simulation of the conventional microwave antenna of FIG. 2.
Figure 5:
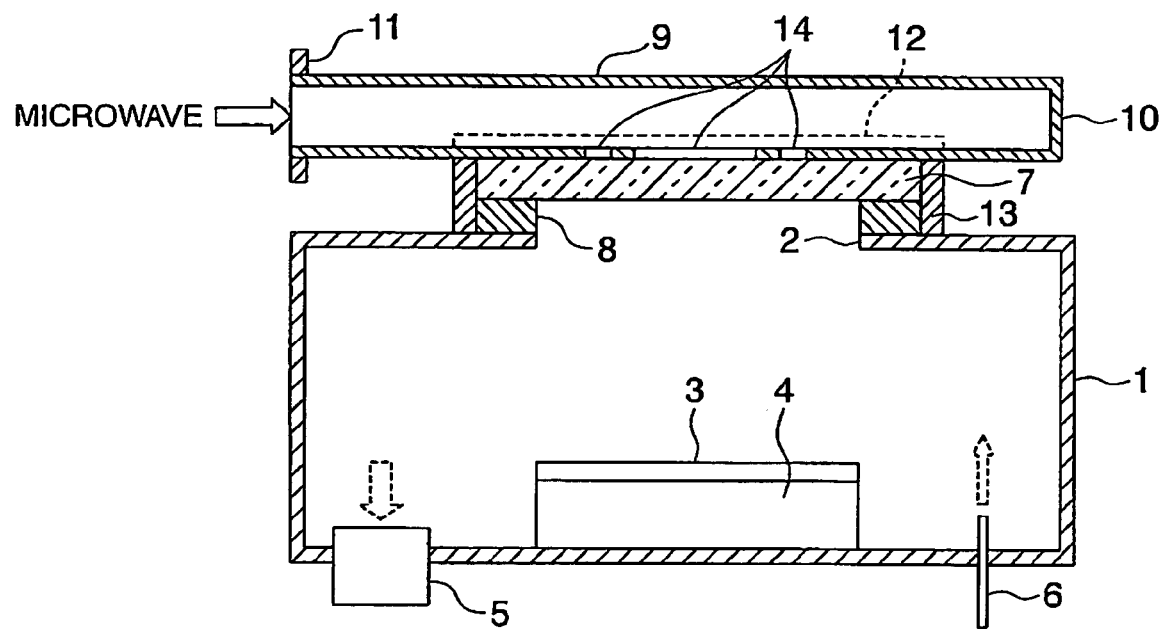
FIG. 5 is a schematic cross sectional view showing an embodiment of the present invention.

FIG. 5 illustrates a microwave-excited plasma processing apparatus according to an embodiment of the present invention.

Referring to FIG. 5, reference symbol 1 denotes a vacuum chamber, which vacuum chamber 1 has an aperture 2 formed through a top wall thereof. A processing table 4 is arranged in the vacuum chamber 1 below the aperture 2 at a position opposite to the aperture 2 in order to bear an object 3 to be processed thereon. The object 3 to be processed is a Si wafer for manufacturing semiconductor devices in this embodiment. The processing table 4 has a heating mechanism and an electrostatic adsorption mechanism (both being not shown) in the inside thereof so that the object 3 of processing can be heated to a predetermined temperature.

In FIG. 5, reference symbol 5 denotes a vacuum exhaust system for exhausting the inside of the vacuum chamber 1 to produce vacuum therein and maintaining the internal pressure thereof to a pressure level adapted to the operation of processing the object 3 of processing, and reference symbol 6 denotes a gas supply pipe for supplying processing gas into the vacuum chamber 1. The vacuum exhaust system 5 is formed by combining a turbo molecular pump and a dry pump and a variable conductance valve is fitted thereto so as to make it possible to exhaust the vacuum chamber 1 at a variable exhaust rate. During a processing operation, a desired gas pressure level can be maintained between 20 and 90 Pa by controlling both the exhaust rate and the flow rate of processing gas flowing in from the gas supply pipe 6.

A microwave introducing window 7 is arranged above the aperture 2 of the top wall of the vacuum chamber 1 with an annular seal member 8 disposed between them so as to maintain the inside of the vacuum chamber 1 in vacuum. The microwave introducing window 7 is made of quartz in the illustrated embodiment. In FIG. 5, reference symbol 9 denotes a rectangular waveguide having a closed end that operates as reflecting end 10. A flange 11 for connecting the waveguide to some other waveguide is arranged at the end opposite to the reflecting end 10 of the rectangular waveguide 9 so that a waveguide may be connected to it in order to transmit a microwave from a microwave power source (not shown). The rectangular waveguide 9 is provided with a circular flange 12, which circular flange 12 is fitted to the vacuum chamber 1 by way of an insulating fitting member 13.

Figure 6:
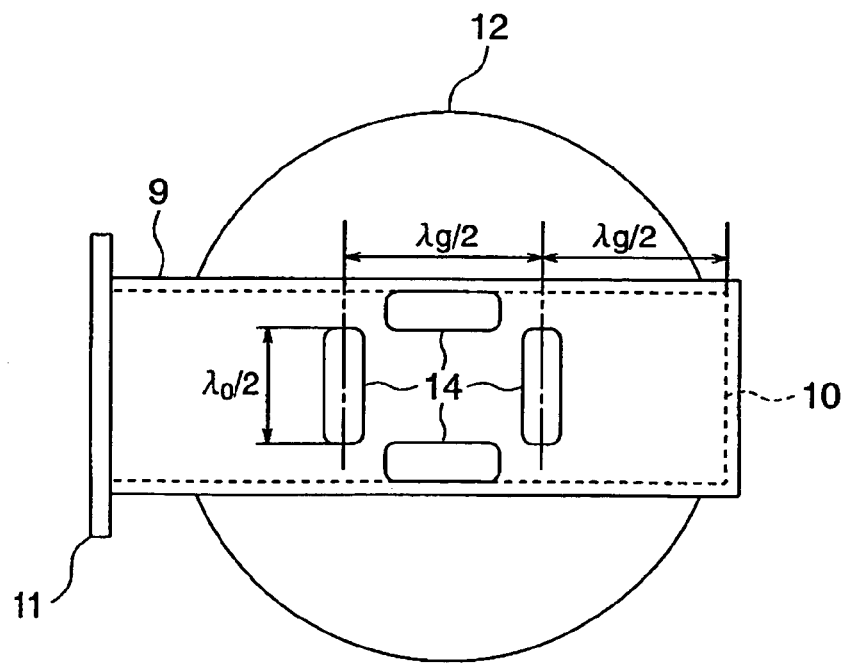
FIG. 6 is a schematic plan view showing a microwave antenna that is a principal part of the embodiment of plasma processing apparatus of FIG. 5.
Figure 7A:
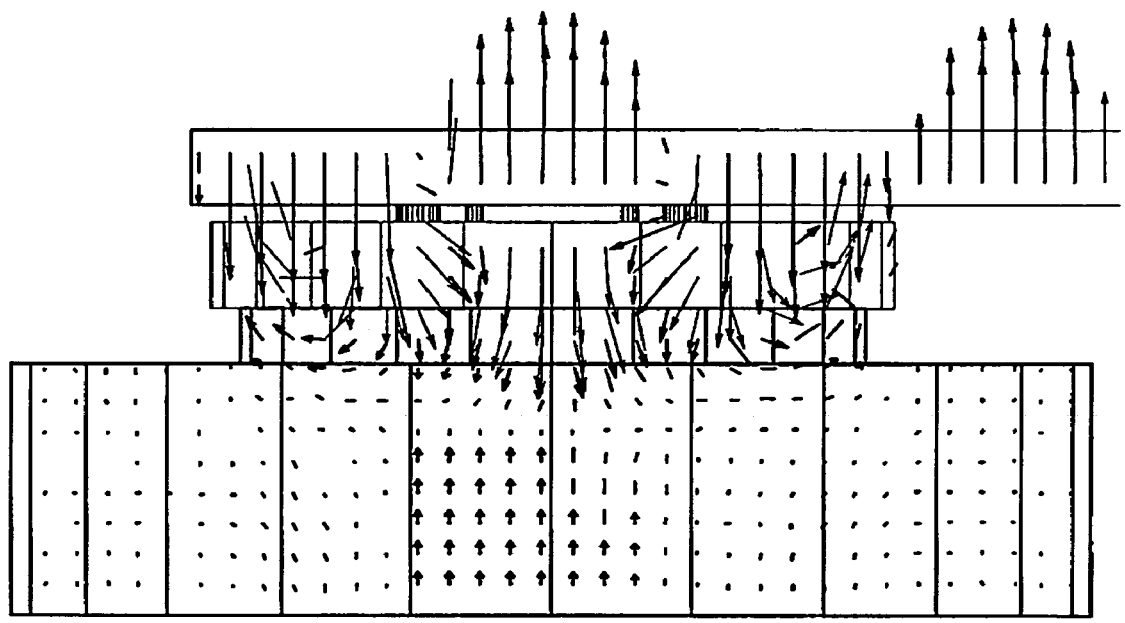
FIG. 7A is a schematic cross sectional view showing a magnetic field of the microwave antenna of FIG. 6 obtained as a result of an electromagnetic field simulation of the microwave antenna.
Figure 7B:
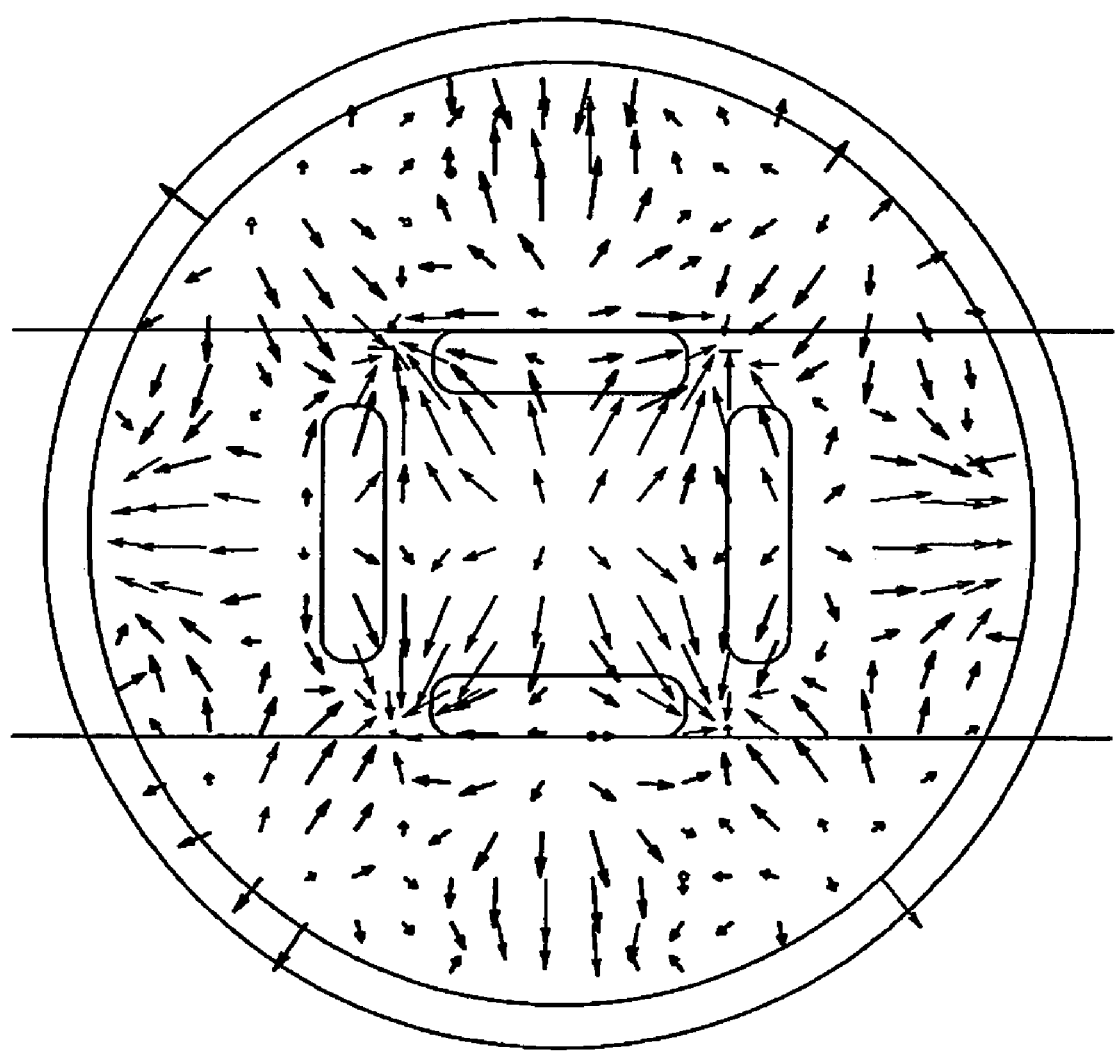
FIG. 7B is a schematic illustration of the magnetic field right below the microwave introducing window obtained as a result of an electromagnetic field simulation of the microwave antenna of FIG. 6.
Figure 7C:
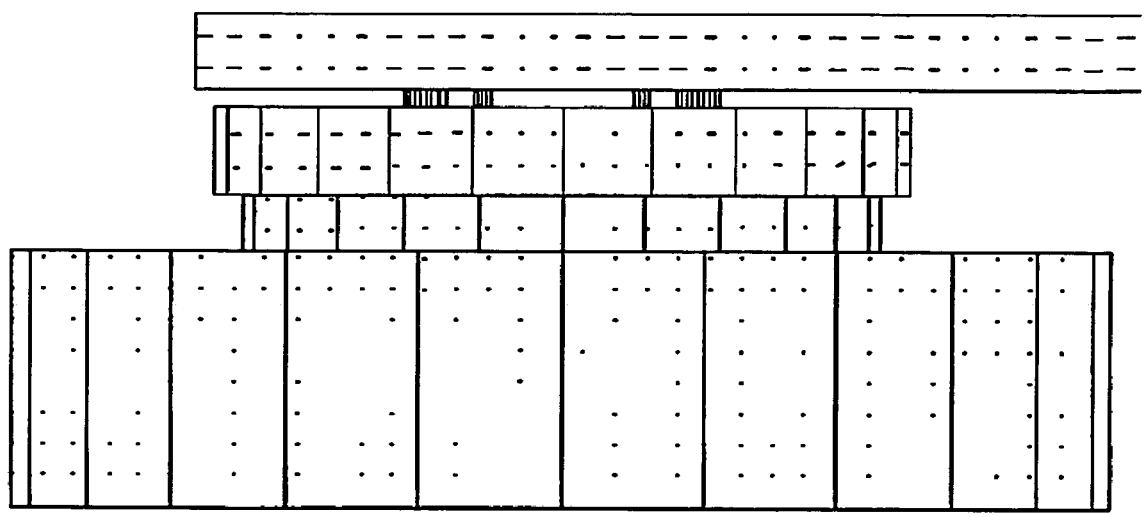
FIG. 7C is a schematic cross sectional view of the electric field of the microwave antenna of FIG. 6 obtained as a result of an electromagnetic field simulation of the microwave antenna.
Figure 7D:
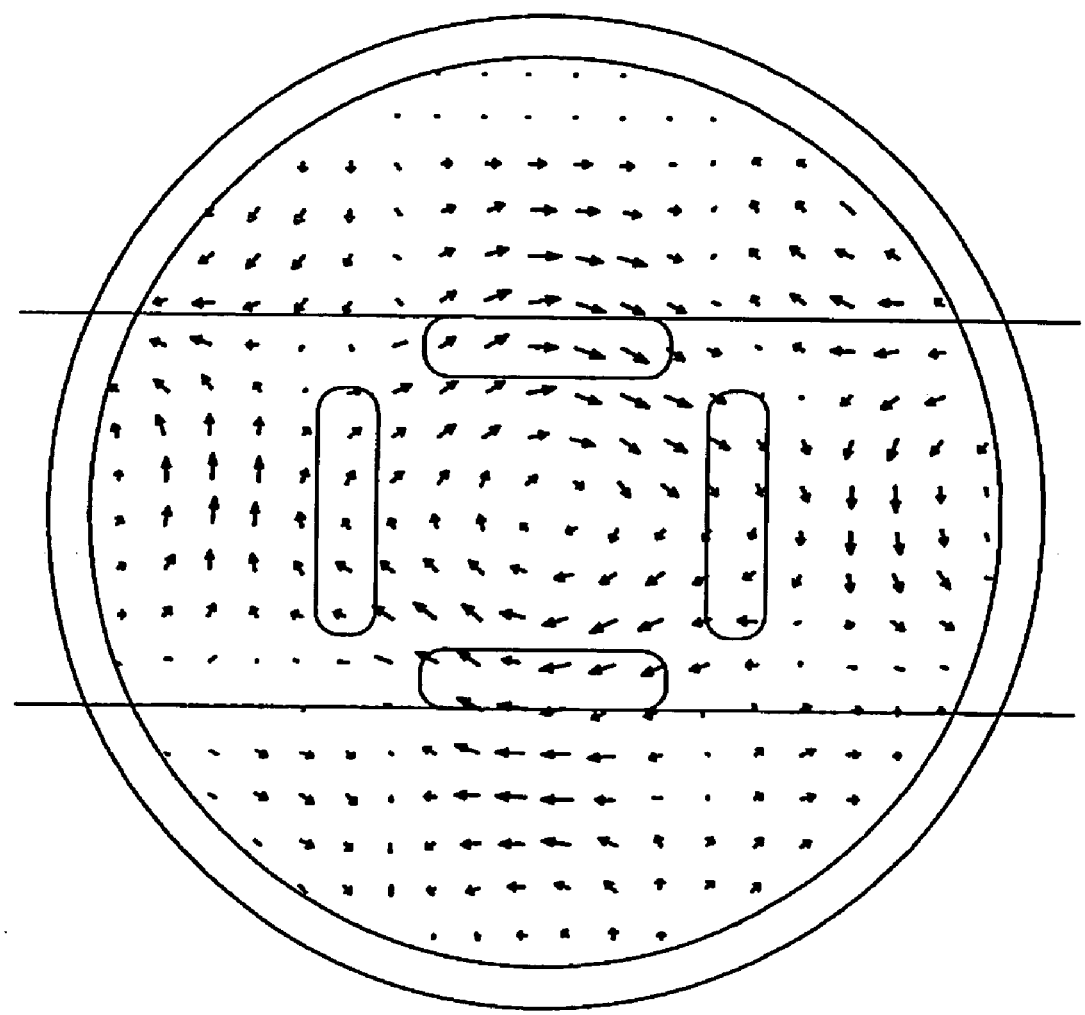
FIG. 7D is a schematic illustration of the electric field right below the microwave introducing window obtained as a result of an electromagnetic field simulation of the microwave antenna of FIG. 6.

The part of the bottom of the rectangular waveguide 9 that is held in contact with the microwave introducing window 7 is provided with four elliptic slits 14. In other words, the slits 14 are exposed to the microwave introducing window 7 arranged above the vacuum chamber 1. As shown in FIG. 6, the four slits 14 are arranged along the respective sides of a rectangle in order to produce a uniform electromagnetic field by a microwave on the surface of the microwave introducing window 7 in the vacuum chamber 1. Thus, a microwave antenna is formed in this way.

The major axis of each of the slits 14 is defined to be equal to ½ of the wavelength ($\lambda_o$) of the microwave in vacuum. With this arrangement, the microwave emitted from the microwave antenna proceeds to the outside of the rectangular waveguide without loss. The minor axis of each of the slits 14 is shorter than the longer axis thereof by definition and made equal to 15 mm so as to maximize the radiation efficiency of the microwave antenna.

Each of the slits 14 has an elliptic contour and does not have any corner in order to eliminate any propagation loss and achieve a high machining efficiency in the process of manufacturing the microwave antenna. Of the four slits 14, the one located closest to the terminal plane or the reflecting plane 10 of the rectangular waveguide 9 is arranged at a position where its central axial line is separated from the reflecting plane by a distance equal to n/2 (n being an integer) of the wavelength ($\lambda g$) of the microwave in the rectangular waveguide 9. With this arrangement, the position of the slit agrees with the peak position of the standing wave of the microwave magnetic field of the TE10 mode in the rectangular waveguide 9 so that the microwave is radiated efficiently.

The paired slits 14 whose major axes are perpendicular relative to the traveling direction of the microwave are separated from each other by a distance equal to m/2 (m being an integer) of the wavelength ($\lambda g$) of the microwave in the rectangular waveguide 9. The paired slits 14 whose major axes are running in parallel with the traveling direction of the microwave are arranged as a function of the size of the rectangular waveguide 9.

In the instance of the embodiment illustrated in FIG. 6, the rectangular waveguide 9 of the microwave antenna is made to have a width of 96 mm. Thus, the major axes of the slits 14 are made to be 61 mm long, or equal to ½ of the wavelength ($\lambda_o$) of the microwave in vacuum. The distance from the reflecting end 10 to the slit 14 located closest to the former is made to be 79 mm, or equal to ½ of the wavelength (158 mm) of the microwave in the rectangular waveguide. This slit is separated from the oppositely disposed slit also by 79 mm. The paired slits that are perpendicular relative to these slits 14, or the paired slits 14 whose major axes are in parallel with the traveling direction of the microwave, are separated from each other in such a way the distance between the center of the slits is close to ½ of the wavelength and the outer edges of the slits are respectively in line with the corresponding inner wall surfaces of the rectangular waveguide 9.

FIGS. 7A, 7B, 7C and 7D show the electromagnetic field generated by the microwave antenna of the embodiment, whose principal part is illustrated in FIG. 6, as obtained by simulation. As seen from these drawings, both the electric field and the magnetic field are least asymmetric and show a uniform distribution. Table 3 below shows the value of the VSWR actually measured by using the microwave antenna of this embodiment in comparison with the corresponding values observed by using the prior art microwave antennas described in Patent Documents 1 and 2.

TABLE 3

| type of microwave antenna | actually measured VSWR |
|---|---|
| prior art microwave antenna of Pat. Doc. 1 | 3.9 |
| prior art microwave antenna of Pat. Doc. 2 | 8.9 |
| microwave antenna of this invention | 1.5 |

From Table 3, it is clear that the VSWR of the microwave antenna of the present invention is smallest and hence the microwave antenna efficiently radiates microwave energy.

In an experiment, a Si wafer for manufacturing semiconductor devices, or an object 3 of processing, was heated to 250° C. and $H_2O$ gas was made to flow at a rate of 300 sccm by way of the gas supply pipe 6 by means of a gas flow rate control system (not shown).

In the actual processing operation of the experiment, the Si wafer, or the object 3 of processing, onto which resist had been applied to a predetermined thickness, was brought into the vacuum chamber 1 and placed on the processing table 4. Then, processing gas was introduced from the gas supply pipe 6 into the vacuum chamber 1 and, at the same time, the internal pressure of the vacuum chamber 1 was held to 20 Pa by regulating the exhaust rate of the exhaust system.

Thereafter, 1.5 kW was applied from the microwave power source to the microwave antenna for about 20 seconds.

The wafer was taken out and the reduction of the resist film thickness was measured to compute the ashing rate and the distribution of the ashing rate on the Si wafer. A similar experiment was conducted by using the prior art microwave antennas described in Patent Documents 1 and 2 under the same condition and the obtained results were compared. Table 4 summarily shows the results.

TABLE 4

| type of microwave antenna | ashing rate (nm/min) | ashing distribution (±%) |
|---|---|---|
| prior art microwave antenna of Pat. Doc. 1 | 936 | 13 |
| prior art microwave antenna of Pat. Doc. 2 | 1782 | 17 |
| microwave antenna of this invention | 2628 | 9 |

From Table 4, it is clear that the microwave antenna of the present invention provides a high ashing rate and a uniform distribution of ashing rate.

The process margin was observed by means of the above described microwave antenna and by using Ar gas as processing gas, changing the pressure and the applied microwave power. Table 5 summarily shows the obtained results.

TABLE 5

| applied electric power/pressure | 20 Pa | 50 Pa | 90 Pa |
|---|---|---|---|
| 1.0 kW | ○ | ○ | ○ |
| 1.5 kW | ○ | ○ | ○ |
| 1.8 kW | ○ | ○ | X |
| 2.0 kW | X | ○ | X |

N.B.:
○ indicates that a normal electric discharge was allowed.
X indicates that a normal electric discharge was not allowed because of a large reflected wave.

It is clear from Table 5 that the range of parameter value that allows a normal electric discharge is broadened to consequently broaden the process margin by using a microwave antenna according to the present invention.

While the microwave introducing window of the illustrated embodiment is made of quartz, the microwave introducing window of a microwave-excited plasma processing apparatus according to the present invention may be made of any material so long as it can transmit a microwave and maintain the inside of the vacuum chamber in vacuum.

While $H_2O$ gas and Ar gas were used in the above-described experiment, the types of gas that can be used as processing gas for a microwave-excited plasma processing apparatus according to the present invention are not limited thereto.

While slits are directly cut through the rectangular waveguide of the illustrated embodiment to produce a microwave antenna, it is also possible to cut slits through the annular flange and provide it with a U-shaped cover to make it show dimensions same as those of the rectangular waveguide.

The present invention can find applications in the field of plasma CVD system when a film forming raw material gas is used. The present invention can also find applications in the field of etcher or surface reforming mechanism when reactive gas is used. In short, a microwave-excited plasma processing apparatus according to the invention has a broad scope of application and provides a broad process margin as a result of the improvement in terms of the contour of the slits cut through the rectangular waveguide and their positioning.

What is claimed is:

1. A microwave-excited plasma processing apparatus for radiating a microwave from a microwave antenna and irradiating processing gas with the microwave to generate a plasma and cause the plasma to act on a substrate, the apparatus comprising:

a vacuum chamber having an aperture in a top wall thereof, a processing table arranged below said aperture for holding the substrate and a microwave introducing window arranged in said aperture of the top wall so as to maintain the inside of the vacuum chamber in vacuum;

a gas supply pipe for supplying processing gas into the vacuum chamber;

an exhaust system for exhausting the inside of the vacuum chamber in order to maintain a vacuum inside of the vacuum chamber;

a rectangular waveguide arranged on, and held in contact with, the microwave introducing window, the rectangular waveguide having a terminal plane extending perpendicularly to the direction of travel of the microwave in the rectangular waveguide;

four slits provided in the wall of the waveguide that is held in contact with the microwave introducing window so as to form the microwave antenna, each said slit having an elliptical contour, the four slits being arranged along the respective four sides of a quadrangle, two of the slits extending in parallel with the direction of travel of the microwave, and the remaining two slits extending perpendicularly to the direction of travel of the microwave, and a major axis of each of the slits being equal to k/2 of the wavelength, $\lambda_0$, of the microwave in a vacuum, wherein k is an integer; and a center of the slit located closest to the terminal plane of the rectangular waveguide being arranged at a position equal to n/2 of the wavelength, $\lambda_g$, of the microwave from the terminal plane in the rectangular waveguide, wherein n is an integer, and a center of the slit located at a position opposite to the slit located closest to the terminal plane being arranged at a position equal to m/2 of the wavelength, $\lambda_g$, of the microwave from the slit located closest to the terminal plane of the rectangular waveguide, wherein m is an integer.

* * * * *